US010116038B1

(12) United States Patent
Mitsufuji et al.

(10) Patent No.: US 10,116,038 B1
(45) Date of Patent: Oct. 30, 2018

(54) MOBILE HOTSPOT SYSTEM

(71) Applicant: Verizon Patent and Licensing Inc., Arlington, VA (US)

(72) Inventors: Ai Mitsufuji, Sunnyvale, CA (US); Kevin Gerard Brennan, Metuchen, NJ (US); Yuk Lun Li, Morganville, NJ (US); Nicole Winston, San Francisco, CA (US); Nolan Eng, Foothill Ranch, CA (US); Paul R. McDonough, Marlboro, NJ (US)

(73) Assignee: Verizon Patent and Licensing Inc., Basking Ridge, NJ (US)

(*) Notice: Subject to any disclaimer, the term of this patent is extended or adjusted under 35 U.S.C. 154(b) by 36 days.

(21) Appl. No.: 15/486,882

(22) Filed: Apr. 13, 2017

(51) Int. Cl.
*H01Q 1/24* (2006.01)
*H05K 5/00* (2006.01)
*H01Q 1/48* (2006.01)
*H04W 84/18* (2009.01)
*H04L 29/08* (2006.01)

(52) U.S. Cl.
CPC ............ *H01Q 1/241* (2013.01); *H01Q 1/246* (2013.01); *H01Q 1/48* (2013.01); *H05K 5/0021* (2013.01); *H04L 67/12* (2013.01); *H04W 84/18* (2013.01)

(58) Field of Classification Search
None
See application file for complete search history.

(56) References Cited

U.S. PATENT DOCUMENTS

| 2004/0033780 A1* | 2/2004 | Kelly | H04B 7/18519 455/11.1 |
| 2008/0070500 A1* | 3/2008 | Rapp | H04N 5/2251 455/41.1 |
| 2015/0289389 A1* | 10/2015 | Conway | B65D 21/0209 220/4.02 |
| 2015/0380818 A1* | 12/2015 | Svendsen | H01Q 5/307 343/700 MS |
| 2016/0087328 A1* | 3/2016 | Lee | H01Q 5/307 343/702 |

OTHER PUBLICATIONS

Verizon Wireless, "Internet Devices", https://www.verizonwireless.com/internet-devices/, Apr. 5, 2017, 3 pages.

* cited by examiner

*Primary Examiner* — Howard Williams

(57) ABSTRACT

A device can include a first ground element to be electrically connected to a module including a cellular antenna. The first ground element and the module can be stackable. The cellular antenna can have a first ground plane provided by a second ground element included in the module. The first ground element can provide a second ground plane for the cellular antenna when the first ground element is electrically connected to the cellular antenna. The second ground plane can be larger than the first ground plane. Radio performance of the cellular antenna with regard to a cellular network is enhanced when the cellular antenna is electrically connected to the first ground element based on the second ground plane.

20 Claims, 12 Drawing Sheets

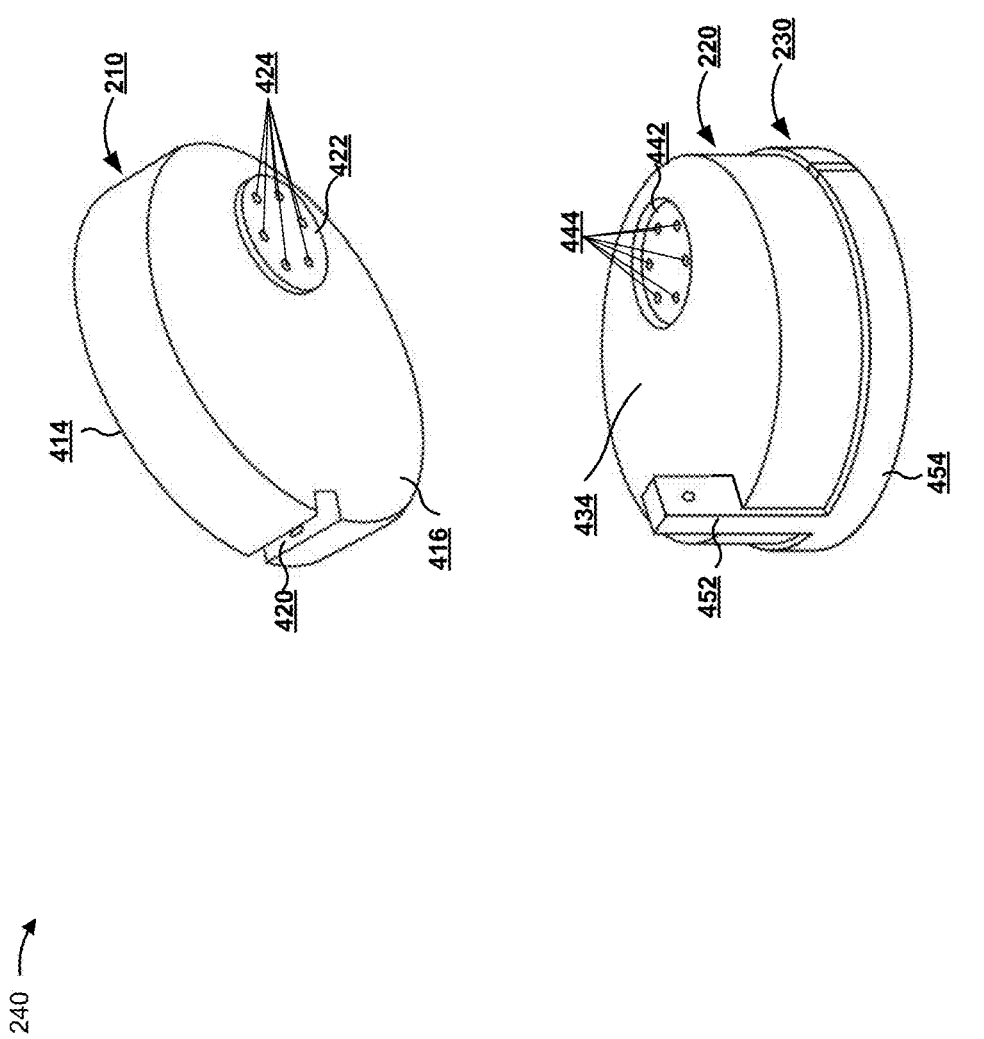

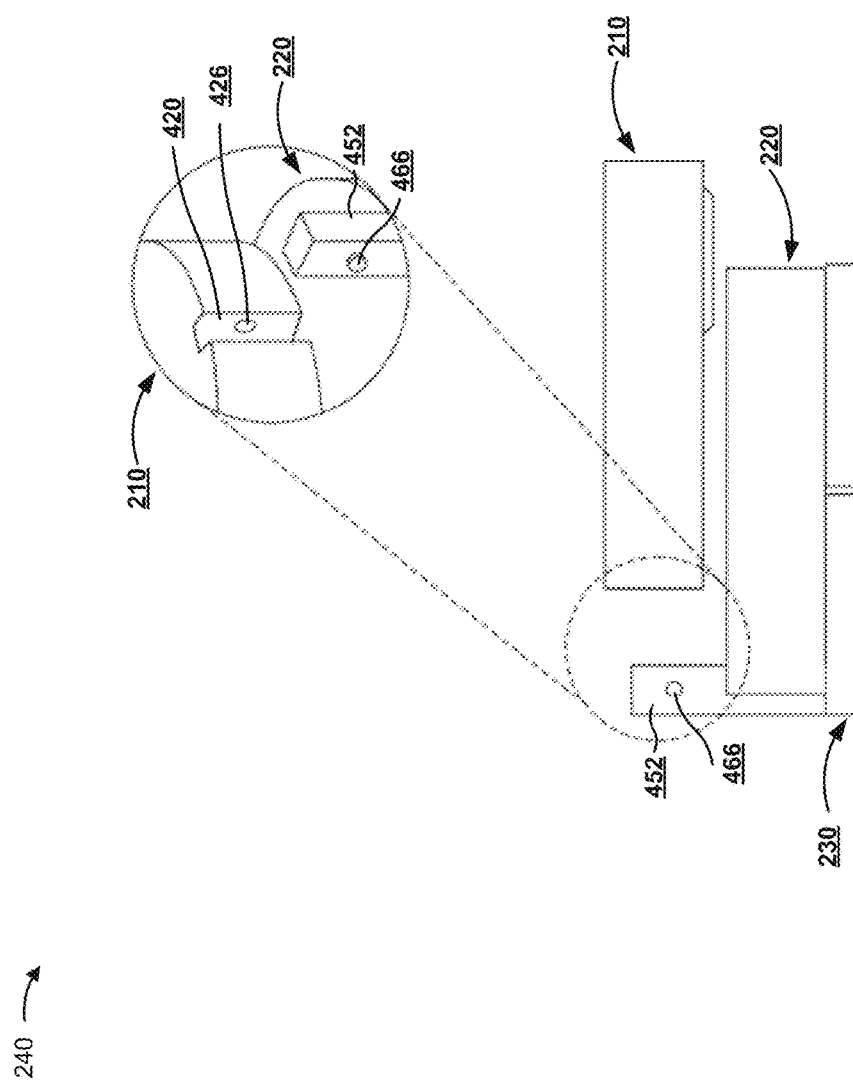

MOBILE HOTSPOT SYSTEM

BACKGROUND

A mobile hotspot is an ad hoc wireless access point that is created by a dedicated hardware device or a smartphone feature that shares the smartphone's cellular data. A mobile hotspot is also known as a portable hotspot. A hardware device used to create a mobile hotspot, which can be called a pocket router or a travel router, can be referred to as a mobile hotspot as well. The device can access cellular signals (e.g., 3G, 4G, etc.) and convert the cellular signals to Wi-Fi and vice versa, creating a mobile Wi-Fi network that can be shared by multiple users within about 10 meters of the device.

The Internet of things (IoT) is the internetworking of physical devices, vehicles (sometimes referred to as "connected devices" and "smart devices"), buildings, and other items that are embedded with electronics, software, sensors, actuators, and network connectivity that enable these physical devices to collect and exchange data. The IoT allows the physical devices to be sensed and/or controlled remotely across network infrastructure, creating opportunities for more direct integration of the physical world into computer-based systems, which results in improved efficiency, accuracy, and economic benefit along with reduced human intervention.

A mobile hotspot offers opportunities for the advancement of the IoT by allowing for connectivity of devices, such as mobile devices.

BRIEF DESCRIPTION OF THE DRAWINGS

FIGS. 4A-4E are diagrams of an example implementation of a mobile hotspot system;

DETAILED DESCRIPTION OF PREFERRED EMBODIMENTS

Figure 1A:
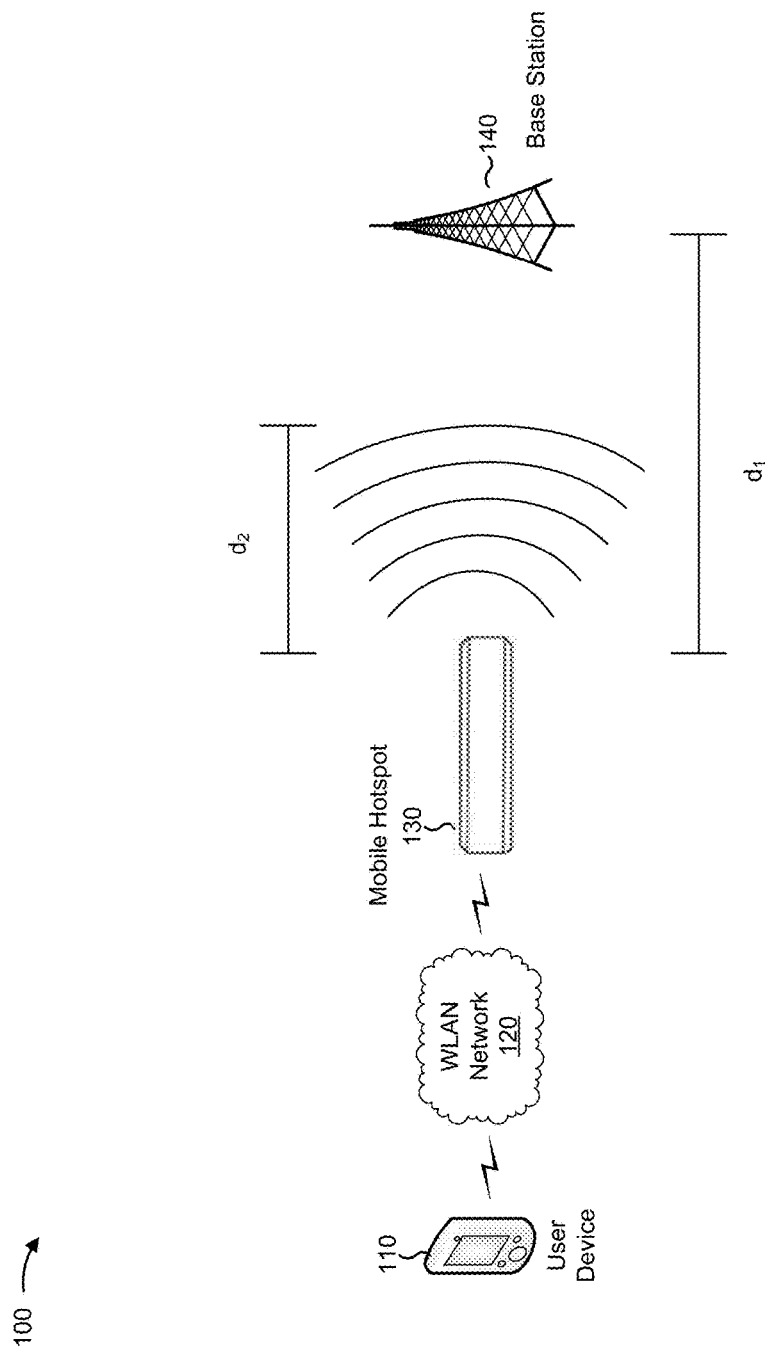
FIGS. 1A and 1B are diagrams of an overview of an example implementation described herein.

The following detailed description of example implementations refers to the accompanying drawings. The same reference numbers in different drawings can identify the same or similar elements.

A mobile hotspot can provide access to a data network (e.g., the Internet) to a device connected to a wireless local area network (WLAN) provided by the mobile hotspot. The mobile hotspot accesses the data network based on the mobile hotspot's connection to a cellular network. Accordingly, a mobile hotspot can offer an alternative way to access a data network compared to a network device that can connected to hardwiring (e.g., wireless access points, cable routers, etc.) in a building. For example, where data network access using a cable line is prohibitively expensive or has poor performance, a user can employ a mobile hotspot associated with a wireless cellular service provider that is more affordable and/or performs more favorably. Further, a mobile hotspot can provide a user with privacy that is not available with public WLAN networks (e.g., Wi-Fi internet access at hotels, shops, etc.). For example, a user can adjust privacy settings on the mobile hotspot so that wireless network access is password protected.

A mobile hotspot can also use a battery as a power source so that the mobile hotspot does not need to be plugged into a power source. Further, the ability of a mobile hotspot to connect to a cellular network can be based on the size and configuration of a cellular antenna that is part of the mobile hotspot. For example, as the size and shape of a mobile hotspot is made smaller to increase portability and decrease the amount of space occupied by the mobile hotspot, the performance of a cellular antenna in the mobile hotspot can also decrease because of the smaller size of the cellular antenna. The size and shape of the mobile hotspot can allow the mobile hotspot to be carried by a user so that, in combination with the battery power source, the mobile hotspot is portable and can provide a user with mobility.

However, a mobile hotspot can have limited range for connecting to a cellular network. As mentioned, the performance of a cellular antenna, of a mobile hotspot, can be reduced based on the form factor of the mobile hotspot and, as a result, the mobile hotspot might be limited in terms of geographic locations for connecting to a cellular network. A mobile hotspot can also have limited useable life based on a capacity of the battery of the mobile hotspot. The battery capacity can limit the amount of time that the mobile hotspot can be used in a portable fashion before the battery must be replaced or recharged. In addition, a mobile hotspot can be of a large size that impedes the portability of the mobile hotspot so that the mobile hotspot cannot be carried easily by a user. For example, a mobile hotspot can be too big and heavy to fit comfortably in a user's pocket or in a carrying case. Furthermore, a mobile hotspot might not offer opportunities to connect a device for wireless network access to the mobile hotspot based on an electrical connection (e.g., a physical connection between two points through which electricity is conducted, a wired connection, a hard connection, etc.). As a wireless network connection might not be suitable or reliable enough for the device, the wireless network connection can limit the devices that can be used with the mobile hotspot. Additionally, a mobile hotspot might not offer opportunities for connecting another device in a modular fashion so that the mobile hotspot and the device can be easily positioned and connected with respect to each other.

Implementations described herein provide a mobile hotspot system that can include a cellular access point with a housing having a disk shape and one or more antennas located inside the housing. In addition, implementations described herein provide a ground element that has an annular shape and that can connect to the cellular access point to provide a larger ground plane for the one or more antennas of the cellular access point as compared to a ground plane that is present when the cellular access point is disconnected from the ground element. The size and shape of the cellular access point and the ground element can be structured so that the cellular access point and the ground element are modular for easy construction and/or flexible arrangement of mobile hotspot system.

In some implementations, one or more additional devices can be included that can have a shape that is complementary to the shape of the ground element and/or the cellular access point so that the one or more additional devices are modular relative to the other components of the mobile hotspot system. The one or more additional devices can also be connected to the cellular access point via an electrical connection. For example, a battery module that corresponds to the size and shape of the cellular access point can be positioned between the cellular access point and the ground element. The battery module can also be connected to the cellular access point via electrical contacts to provide power to the cellular access point.

In some implementations, the one or more additional devices can provide and/or receive information via access to a data network provided by the cellular access point. Additionally, the size and shape of the cellular access point and the ground element can make the cellular access point, the ground element, and/or the combination of the cellular access point and ground element combination portable, as described in more detail below. In some implementations, the size and shape of the cellular access point can also allow for the cellular access point to be attached to a vehicle (e.g., a drone, an automobile, etc.) or carried by a person (e.g., by attaching via a belt clip, lanyard, etc.).

In this way, the mobile hotspot system can provide access to a data network based on enhanced performance of an antenna. The mobile hotspot system can also provide portability and modularity of the components of the mobile hotspot system. For example, the ground element can act as an antenna booster for the cellular access point and the cellular access point can have a greater range for accessing one or more devices of a cellular network. Additionally, the size and shape of the ground element and the cellular access point can allow the ground element and the cellular access point to be easily positioned and connected with respect to each other. Additional devices can also be connected to the cellular access point to provide aspects of modularity, improve performance, and provide portability based on those additional devices. For example, a battery module can be easily positioned and connected to the cellular access point to extend the useable life of the cellular access point while also allowing the cellular access point to be portable. Additional devices can also be connected to the cellular access point to provide increased functionality based on those additional devices. In some implementations, the additional devices can include a camera, a speaker, a projector, and/or a sensor. Furthermore, the cellular access point can provide access to a data network for the additional devices based on an electrical connection with the cellular access point where the access might not be possible without using the electrical connection to the cellular access point.

Figure 1B:
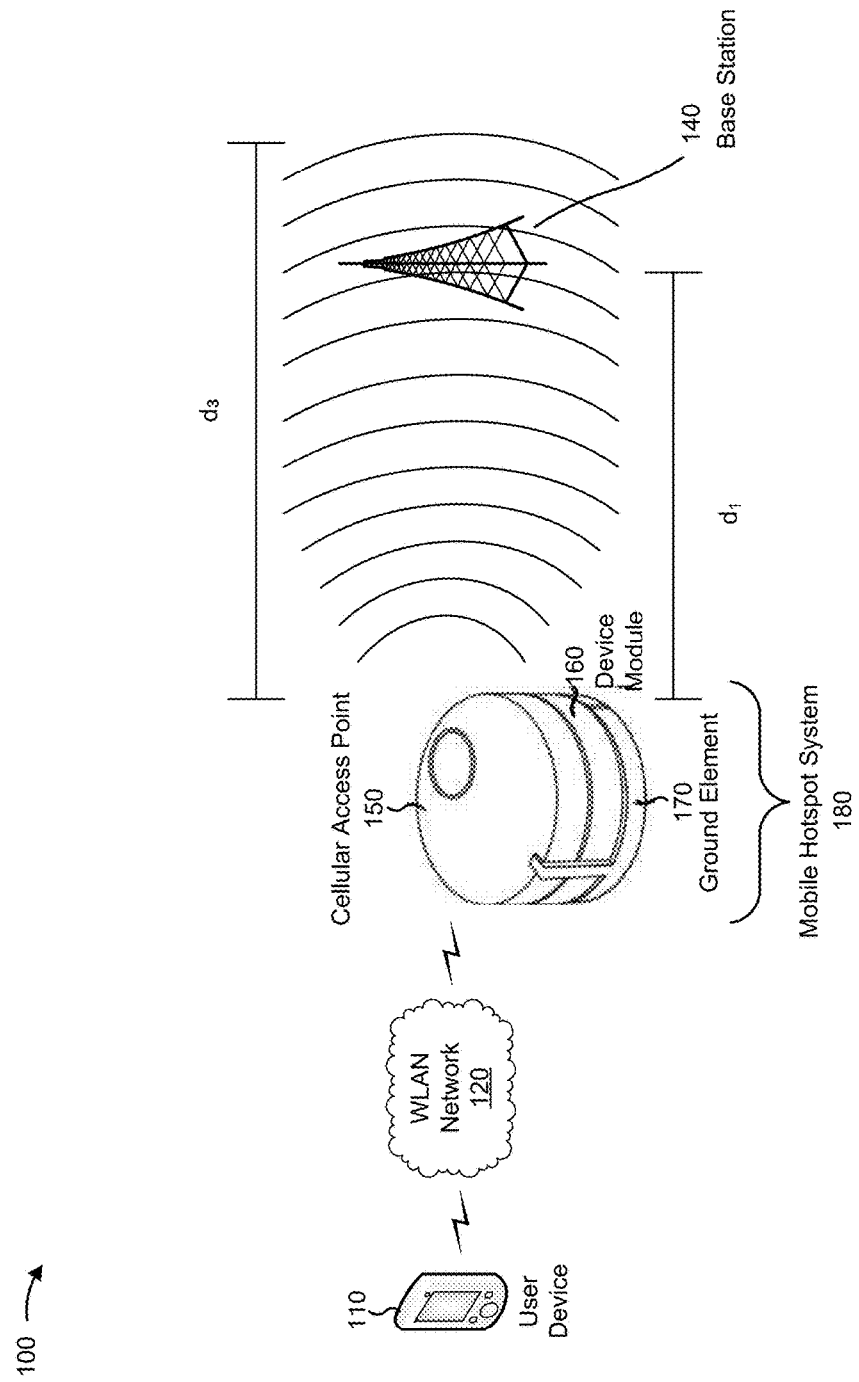

FIGS. 1A and 1B are diagrams of an overview of example implementation 100 described herein. FIG. 1A shows user device 110 connected to wireless local area network (WLAN) 120 provided by mobile hotspot 130. Mobile hotspot 130 is configured to provide user device 110 with access to a cellular network associated with base station 140. However, as shown in FIG. 1A, base station 140 is located at a distance $d_1$ away from mobile hotspot 130 and distance $d_2$ is the range of the cellular signal provided by mobile hotspot 130. Since $d_1$ is greater than $d_2$, base station 140 is outside the range of the cellular signal from mobile hotspot 130 and user device 110 cannot access the cellular network provided by base station 140. When base station 140 is outside the range of the cellular signal from mobile hotspot 130, base station 140 might not receive the cellular signal or base station 140 can receive the cellular signal but the quality of the cellular signal is so poor that the cellular signal is unusable by base station 140. When base station 140 is within range of the cellular signal of mobile hotspot 130, base station 140 can receive a good quality signal from mobile hotspot 130. The range of mobile hotspot 130 can be based on an inbuilt cellular antenna of the mobile hotspot 130 that is limited in performance by a form factor of mobile hotspot 130.

FIG. 1B shows that mobile hotspot 130 has been replaced by cellular access point 150 that is connected with device module 160 and ground element 170. Cellular access point 150, device module 160, and ground element 170 will be collectively referred to as a mobile hotspot system 180.

The range of a cellular signal transmitted by cellular access point 150 is extended when cellular access point 150 is electrically connected to device module 160 and ground element 170. The range of cellular access point 150 is based on a ground plane provided by ground element 170 that reflects radio signals transmitted by an antenna of cellular access point 150. The range of cellular access point 150 can also be based on the space between cellular access point 150 and ground element 170 that is provided by device module 160.

As shown in FIG. 1B, the range of the cellular signal of cellular access point 150 is shown as distance $d_3$ and cellular access point 150 is located at a distance $d_1$ from base station 140. The distance $d_1$ shown in FIG. 1B is the same as the distance between mobile hotspot 130 and base station 140 shown in FIG. 1A. As shown in FIG. 1B, since the range of the cellular signal, $d_3$, provided by cellular access point 150 is greater than $d_1$, user device 110 has access to the cellular network associated with base station 140. While device module 160 can provide an amount of space between cellular access point 150 and ground element 170 to enhance a cellular signal transmitted by cellular access point 150, device module 160 can also provide additional functionality. In some implementations, device module 160 can include a battery to provide power to cellular access point 150. In some implementations, device module 160 can include a camera, a speaker, or a projector. For example, device module 160 can include a camera that broadcasts a video stream via the cellular network and to the Internet for access via the Internet.

In this way, cellular access point 150 can provide a cellular signal that has an extended range when cellular access point 150 is electrically connected to ground element 170 as compared to when cellular access point 150 is not electrically connected to ground element 170. Furthermore, the performance of cellular access point can be enhanced based on a space between cellular access point 150 and ground element 170. In some implementations, that space is provided when device module 160 is located between cellular access point 150 and ground element 170. In addition, cellular access point 150 can have an extended useable life and increased portability based on device module 160 providing a battery as a power source to cellular access point 150. Additionally, device module 160 can provide additional devices that allow a user to provide information via a cellular network and a data network, such as the Internet.

As indicated above, FIGS. 1A and 1B are provided merely as an example. Other examples are possible and can differ from what was described with regard to FIGS. 1A and 1B.

Figure 2:
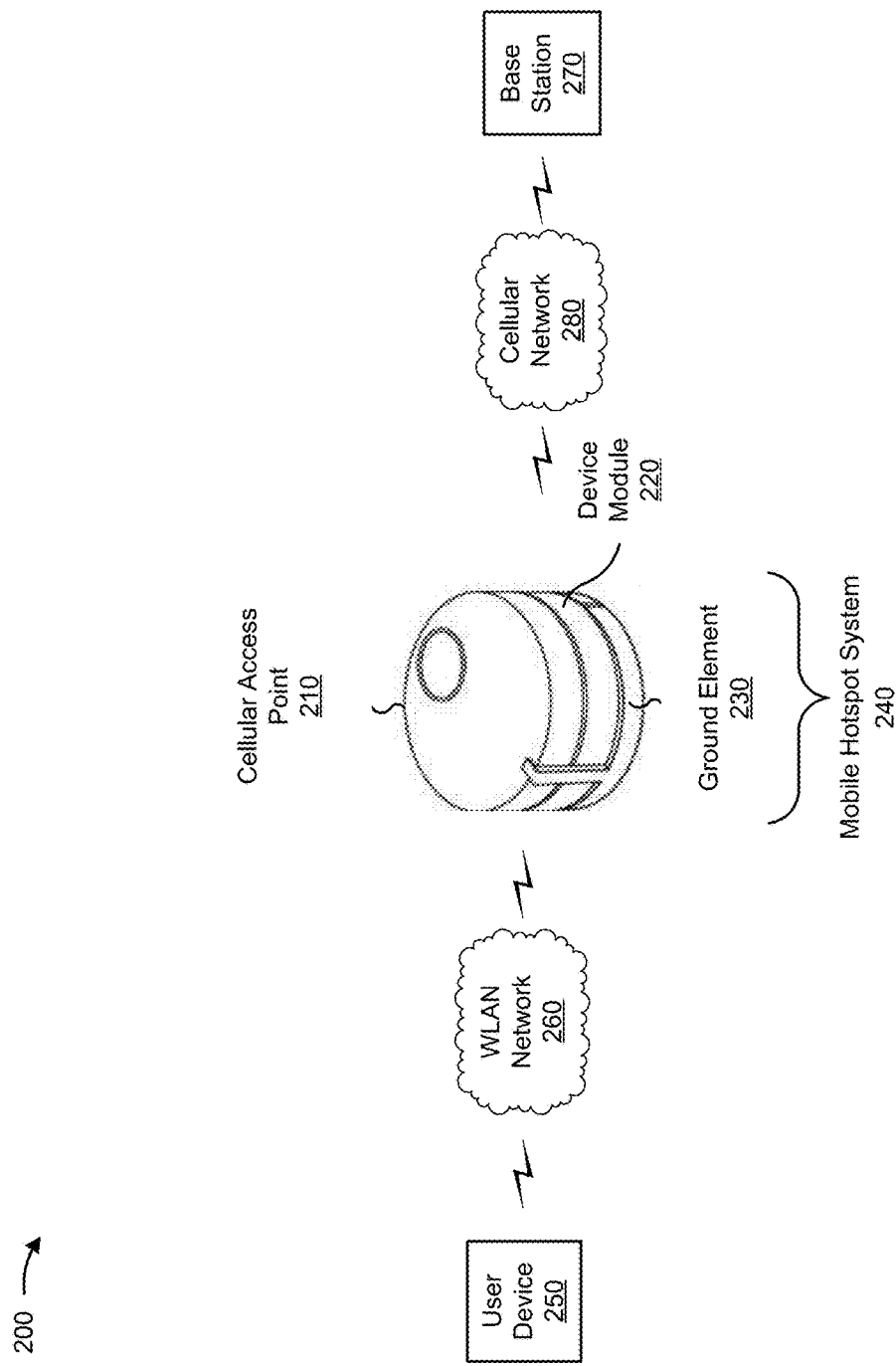
FIG. 2 is a diagram of an example environment in which systems and/or methods, described herein, can be implemented.

FIG. 2 is a diagram of an example environment 200 in which systems and/or methods, described herein, can be implemented. As shown in FIG. 2, environment 200 can include cellular access point 210, device module 220, ground element 230, user device 250, WLAN network 260, base station 270, and cellular network 280. As shown in FIG. 2, mobile hotspot system 240 is made up of cellular access point 210, device module 220, and/or ground element 230 connected together. Devices of environment 200 can interconnect via wired connections, wireless connections, or a combination of wired and wireless connections.

Cellular access point 210 includes a device capable of providing access to a cellular network, such as cellular network 280 (e.g., a 4G network, a Long Term Evolution (LTE) network, an LTE advanced network, a 5G network, etc.), and functioning as a mobile hotspot, a home connectivity device, and/or a home network device. In some implementations, cellular access point 210 can be configured to operate as a router, a gateway, a modem, or the like. In some implementations, cellular access point 210 can connect one or more devices (e.g., user device 250) to the Internet and/or a cellular network based on a wireless network (e.g., WLAN network 260) provided by cellular access point 210. For example, cellular access point 210 can include a wireless access point that provides the wireless network. In some implementations, cellular access point 210 can correspond to cellular access point 150 shown in FIG. 1B.

Device module 220 includes one or more devices that are capable of connecting to cellular access point 210 using an electrical connection. In some implementations, device module 220 can include one or more components to perform a function based on an interaction with a user, user device 250, and/or cellular access point 210. In some implementations, device module 220 can include an Internet of Things (IoT) device or functionality associated with an IoT device. For example, device module 220 can include a battery, a camera, a projector, a speaker, a radio, a display device, a radio transceiver, a smart home device, a controller, a sensor, a health monitor, a personal information manager (PIM) device, an intelligent personal assistant (IPA) device, a network diagnostics device, or the like. In some implementations, device module 220 can correspond to device module 160 shown in FIG. 1B.

Ground element 230 includes a passive electronic element that is capable of electrically connecting to cellular access point 210 and providing a ground plane for the antenna(s) of cellular access point 210 to enhance radio performance of the antenna(s). A passive electronic element is referred to as being "passive" since the passive electronic element cannot control voltage or current in a circuit (e.g., a circuit in cellular access point 210). Ground element 230 can provide a ground plane that is larger than the ground plane of cellular access point 210 that is present when cellular access point 210 is not connected to ground element 230. In some implementations, ground element 230 can correspond to ground element 170 shown in FIG. 1B.

In some implementations, mobile hotspot system 240 includes cellular access point 210 and ground element 230. In some implementations, mobile hotspot system 240 includes cellular access point 210, device module 220, and ground element 230. In some implementations, mobile hotspot system 240 includes cellular access point 210, multiple device modules 220, and ground element 230. Mobile hotspot system 240 is capable of performing functions based on cellular access point 210, device module 220, and/or ground element 230. In some implementations, mobile hotspot system 240 can correspond to mobile hotspot system 180 shown in FIG. 1B.

User device 250 includes one or more devices capable of receiving information from and/or providing information to cellular access point 210 via a wireless network (e.g., WLAN network 260). For example, user device 250 can include a communication and/or computing device, such as a mobile device (e.g., a smart phone, a radiotelephone, etc.), a laptop computer, a tablet computer, a handheld computer, a desktop computer, a gaming device, a wearable communication device (e.g., a smart wristwatch, a pair of smart eyeglasses, etc.), or a similar type of device. In some implementations, user device 250 can correspond to user device 110 shown in FIGS. 1A and 1B.

WLAN network 260 includes a wireless local area network (WLAN), an ad hoc network, a Wi-Fi network, and/or a combination of these or other types of wireless networks. In some implementations, WLAN network 260 can correspond to WLAN network 120 shown in FIGS. 1A and 1B.

Base station 270 includes one or more devices capable of transferring traffic, such as audio, video, text, and/or other traffic, destined for and/or received from user device 250 and/or device module 220 via cellular access point 210 and cellular network 280. Base station 270 can send traffic to and/or receive traffic from user device 250 and/or device module 220 via an air interface (e.g., a radio frequency (RF) signal). In some implementations, base station 270 can include a small cell base station, such as a base station of a microcell, a picocell, and/or a femtocell. In some implementations, base station 270 can correspond to base station 140 shown in FIGS. 1A and 1B.

Cellular network 280 includes a cellular network, such as a long-term evolution (LTE) network, a code division multiple access (CDMA) network, a 3G network, a 4G network, a 5G network, a next generation network (NGN), and/or a combination of these or other types of cellular networks.

The number and arrangement of devices and networks shown in FIG. 2 are provided as an example. In practice, there can be additional devices and/or networks, fewer devices and/or networks, different devices and/or networks, or differently arranged devices and/or networks than those shown in FIG. 2. Furthermore, two or more devices shown in FIG. 2 can be implemented within a single device, or a single device shown in FIG. 2 can be implemented as multiple, distributed devices. Additionally, or alternatively, a set of devices (e.g., one or more devices) of environment 200 can perform one or more functions described as being performed by another set of devices of environment 200.

Figure 3:
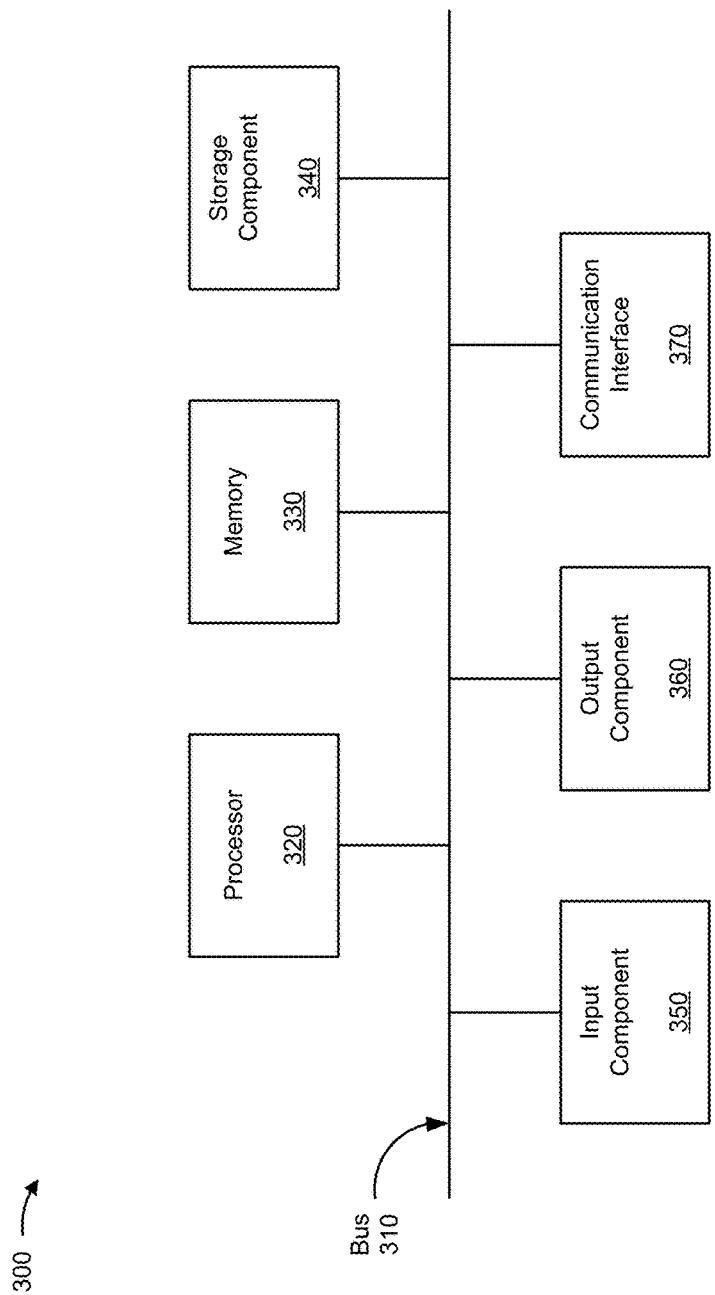
FIG. 3 is a diagram of example components of one or more devices of FIG. 2.

FIG. 3 is a diagram of example components of a device 300. Device 300 can correspond to cellular access point 210, device module 220, user device 250, and/or base station 270. In some implementations, cellular access point 210, device module 220, user device 250, and/or base station 270 can include one or more devices 300 and/or one or more components of device 300. As shown in FIG. 3, device 300 can include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 can include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 can include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 can permit device 300 to receive information from another device and/or provide information to another device. For example, communication interface 370 can include an Ethernet interface, an optical interface, a coaxial interface, an infrared interface, a radio frequency (RF) interface, a universal serial bus (USB) interface, a Wi-Fi interface, a cellular network interface, or the like.

Device 300 can perform one or more processes described herein. Device 300 can perform these processes in response to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions can be read into memory 330 and/or storage component 340 from another computer-readable medium or from another device via communication interface 370. When executed, software instructions stored in memory 330 and/or storage component 340 can cause processor 320 to perform one or more processes described herein. Additionally, or alternatively, hardwired circuitry can be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 can include additional components, fewer components, different components, or differently arranged components than those shown in FIG. 3. Additionally, or alternatively, a set of components (e.g., one or more components) of device 300 can perform one or more functions described as being performed by another set of components of device 300.

Figure 4A:
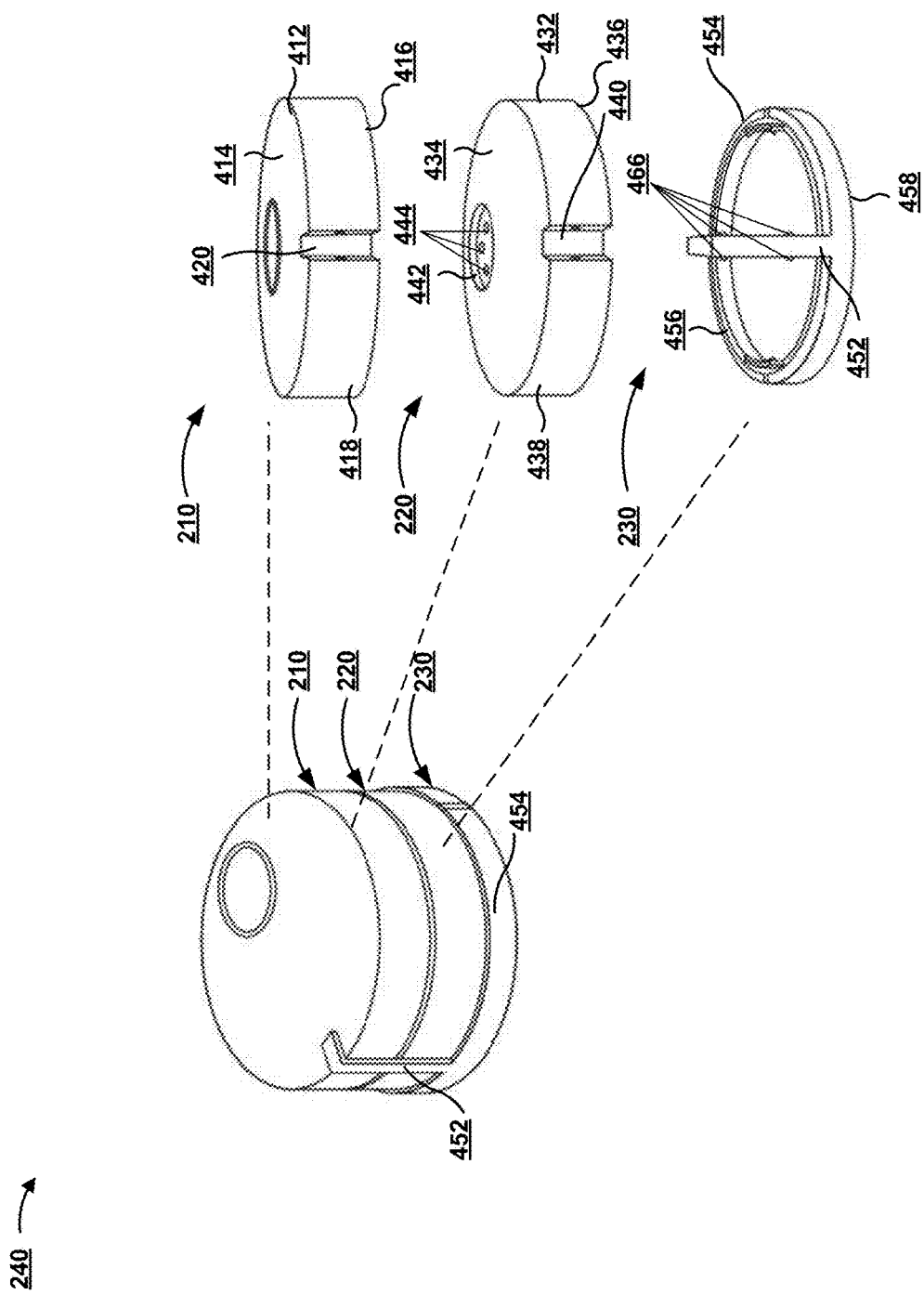

FIGS. 4A-4E are diagrams of an example implementation of a mobile hotspot system 240. As shown in FIG. 4A, mobile hotspot system 240 can include cellular access point 210, device module 220, and ground element 230. In the description to follow, cellular access point 210 and/or device module 220 can be generically referred to as a module (singularly) or modules (collectively) of mobile hotspot system 240. Accordingly, the size and shape of cellular access point 210 can be the same or similar to device module 220 and vice versa. In the description to follow, cellular access point 210 and device module 220 will be described as having a general cylindrical shape. In some implementations, cellular access point 210 and/or device module 220 may have a different geometric shape.

In some implementations, the size and shape of each of cellular access point 210, device module 220, and ground element 230 can enable modular assembly of mobile hotspot system 240. For example, cellular access point 210, device module 220, and/or ground element 230 can be stackable and can be assembled in a stack configuration of mobile hotspot system 240. In some implementations, cellular access point 210, device module 220, and/or ground element 230 can correspond or be complimentary in size and shape. For example, a module can have a shape that is complementary to the shape of ground element 230 and the shape allows the module to fit into ground element 230. In some implementations, cellular access point 210 and device module 220 can each connect to ground element 230 in the same or similar way based on the physical structure of each of cellular access point 210 and device module 220.

By providing components that are modular, mobile hotspot system 240 allows for easy assembly of components (e.g., cellular access point 210, device module 220, and ground element 230) and easy replacement of different components (e.g., different device modules 220) that can save user time and effort and ensure proper connection, and therefore proper functionality, of the components of mobile hotspot system 240.

As further shown in FIG. 4A, cellular access point 210 can include a housing 412. In some implementations, housing 412 can include first surface 414, second surface 416, and one or more side surfaces 418. In some implementations, housing 412 can be made from a material (e.g., a polymer material, a thermoplastic polymer material, a plastic material, a non-interfering plastic material, a dielectric plastic material, a dielectric thermoplastic material, etc.) that does not interfere with a cellular signal provided by and/or received by cellular access point 210. For example, housing 412 can be made from a plastic material such as polycarbonate (PC), Acrylonitrile butadiene styrene (ABS), a plastic material sold under the trademark name PREPERM®, a plastic material sold under the trademark name PRE-ELEC®, and/or the like.

In some implementations, cellular access point 210 can have a shape based on housing 412. For example, cellular access point 210 can have a cylindrical shape. In some implementations, cellular access point 210 can include channel 420 in the one or more side surfaces 418 of housing 412. For example, channel 420 can be located in side surface 418, can extend from first surface 414 to second surface 416, and/or can include a size and/or shape to receive a portion of ground element 230. In some implementations, cellular access point 210 can include an indicator to provide an indication to a user that cellular access point 210 has been activated. For example, cellular access point 210 can include a light on first surface 414.

As further shown in FIG. 4A, device module 220 can include housing 432. In some implementations, housing 432 can include first surface 434, second surface 436, and one or more side surfaces 438. In some implementations, device module 220 can have a shape based on housing 432. For example, device module 220 can have a cylindrical shape. In some implementations, device module 220 can include channel 440 in the one or more side surfaces 438 of housing 432. For example, channel 440 can be located in side surface 438, can extend from first surface 434 to second surface 436, and/or can include a size and/or shape to receive a portion of ground element 230. In some implementations, device module 220 can include interface 442. In some implementations, interface 442 can include a recessed pad (e.g., a circular pad) in first surface 434 of housing 432.

As further shown in FIG. 4A, interface 442 can include a plurality of electrical contacts 444 (e.g., conductive surfaces, conductive metal pieces, tabs, pads, vias, pins, spring pins, galvanic pins, pogo pins, etc.) for providing and/or receiving power and/or data. In some implementations, electrical contacts 444 can be configured to implement a configuration (e.g., an industry standard, Universal Serial Bus (USB), micro USB, etc.) for connecting electronic devices. As one particular example, electrical contacts 444 can correspond to six USB pins, where one pin provides a connection for power, one pin provides a connection for ground, and the remaining four pins provide connections for communicating data.

As further shown in FIG. 4A, ground element 230 can include post 452 and base section 454. In some implementations, post 452 extends away from base section 454 at approximately a 90 degree angle. In some implementations, post 452 is made from a conductive material. In some implementations, base section 454 of ground element 230 can include first surface 456 and second surface 458. In some implementations, post 452 can include one or more protrusions 466 that can provide a connection (e.g., an electrical connection) between post 452 of ground element 230 and a module (e.g., cellular access point 210 and/or device module 220). For example, a pair of protrusions 466 can be included on opposite sides of post 452 and the pair of protrusions 466 can fit into one or more recesses in channel 420 of cellular access point 210 to hold cellular access point 210 in place with respect to ground element 230. In some implementations, post 452 can include a pair of protrusions 466 for each module (e.g., cellular access point 210, a first device module 220, a second device module 220, etc.) that is to be connected to ground element 230. In some implementations, one or more protrusions 466 can be evenly spaced along a length of post 452. In some implementations, one or more protrusions 466 can include a conductive spring pin that can retract inward towards post 452 and extend outward from post 452.

In some implementations, post 452 can be sized and configured to expand and/or collapse. For example, post 452 can include a first section and a second section, where the second section can expand in a direction away from the first section to increase in height and to allow additional device modules 220 to be connected to post 452. In addition, the second section can collapse in a direction towards the first section to decrease in height and to allow fewer device modules to be connected to post 452. In some implementations, post 452 can expand and contract based on one or more conductive spring pins. For example, post 452 can include a conductive spring pin that can be compressed to allow for relative movement of a first section of post 452 and a second section of post 452.

In some implementations, cellular access point 210 can provide user device 250 with access to a data network (e.g., the Internet) via WLAN network 260 and cellular network 280. For example, cellular access point 210 can receive information from user device 250 via WLAN network 260 and cellular access point 210 can provide the information to base station 270 via cellular network 280. Base station 270 can provide the information to the data network in response to cellular access point 210 providing the information. In some implementations, cellular access point 210 can provide connectivity to a wireless network, such as a 3G network, a 4G network, a 5G network, a CDMA network, or the like.

In some implementations, device module 220 can provide power and/or data to cellular access point 210. For example, device module 220 can include a battery that can provide 1800-2400 mAh of power to cellular access point 210. In some implementations, the battery can support more than 15 hours of useable life to cellular access point 210. In some implementations, device module 220 can include a component or functionality associated with a component that receives information from a user and/or a user device 250 and device module 220 can provide the information to a data network. For example, device module 220 can include a personal information manager (PIM) device that can receive a verbal instruction from a user and carry out a task (e.g., send a communication, make an appointment, make on online purchase, etc.) over the Internet based on the verbal instruction of the user. In some implementations, device module 220 can include a component or functionality associated with a component that receives information from a data network and device module 220 can provide the information to a user. For example, device module 220 can include a projector that receives video files and presents the video files for display to the user. Additionally, or alternatively, device module 220 can include a media player that receives video files, audio files, and/or multimedia files, and outputs the video files, the audio files, and/or the multimedia files for presentation to the user.

By providing device module 220 that can provide power and/or data to cellular access point 210 and that can include one or more components to perform a function based on an interaction, mobile hotspot system 240 can offer the user a wide variety of experiences associated with device module 220. Furthermore, by providing device module 220 that includes a battery, device module 220 can extend the useable life of cellular access point 210 as compared to the useable life of cellular access point 210 without the battery of device module 220.

In some implementations, device module 220 can receive information associated with cellular access point 210 and can provide the information to cellular access point 210. For example, device module 220 can receive configuration settings for cellular access point 210 via a first interface (e.g., a USB interface) of device module 220 that provides a connection to user device 250 and device module 220 can provide the configuration settings to cellular access point 210 via a second interface of device module 220 that provides a connection to cellular access point 210.

In some implementations, ground element 230 can enhance radio performance of the antenna(s) of cellular access point 210 with regard to cellular network 280. For example, ground element 230 can increase the signal strength of a cellular signal transmitted by the antenna(s) of cellular access point 210 and/or ground element 230 can provide better reception of a cellular signal directed to the antenna(s) of cellular access point 210. Ground element 230 can enhance the radio performance by providing a first ground plane for the antenna(s) of cellular access point 210 when cellular access point 210 is electrically connected to ground element 230 that is larger than a second ground plane that is associated with the antenna(s) when cellular access point 210 is not electrically connected to ground element 230. The first ground plane enhances the radio performance of the antenna(s) of cellular access point 210 by providing a larger surface from which to reflect the cellular signal provided by and/or received by the antenna(s) of cellular access point 210.

In some implementations, the radio performance of the antenna(s) of cellular access point 210 can be further enhanced based on a spacing between cellular access point 210 and ground element 230. For example, device module 220 can be located between cellular access point 210 and ground element 230 to provide a predetermined distance between cellular access point 210 and ground element 230 to further enhance the radio performance. Radio performance can be enhanced when the antenna(s) is spaced from the first ground plane provided by ground element 230 based on the first ground plane reflecting a larger portion of the cellular signal provided by the antenna(s) to cellular network 280 and the first ground plane reflecting a larger portion of the cellular signal from cellular network 280 at the antenna(s) than when the antenna(s) is not spaced apart from the first ground plane.

In some implementations, cellular access point 210 can provide access to a data network (e.g., the Internet) when cellular access point 210 is not electrically connected to ground element 230. For example, cellular access point 210 can provide access to a data network for user device 250 based on a cellular signal from cellular access point 210 that is provided when cellular access point 210 is not electrically connected to ground element 230. However, cellular access point 210 might provide the cellular signal with less range than when cellular access point 210 is electrically connected to ground element 230. The cellular signal might have less range when cellular access point 210 is not electrically connected to ground element 230 because a ground plane associated with the antenna(s) of cellular access point 210 is smaller than the ground plane provided by ground element 230 when cellular access point 210 is electrically connected to ground element 230. In some implementations, cellular access point 210 can include a battery inside housing 412 that provides power to circuitry for providing a cellular signal and/or a signal associated with WLAN network 260 when cellular access point 210 is not otherwise connected to a power source.

In some implementations, cellular access point 210 can be attached to other mobile items (e.g., vehicles, drones, cars, etc.) to provide access to a data network via a cellular signal from cellular access point 210. For example, cellular access point 210 can be attached to a drone and connected to a camera of the drone so that cellular access point 210 can provide a video stream of the drone's flight via the data network.

As further shown in FIG. 4A, mobile hotspot system 240 can include cellular access point 210, device module 220, and ground element 230 in a stacked configuration. In some implementations, channel 420 of cellular access point 210 can be complimentary to the size and shape of post 452 of ground element 230 and post 452 can fit into channel 420. In some implementations, channel 440 of device module 220 can be complimentary to the size and shape of post 452 and post 452 can fit into channel 440. In some implementations, when post 452 is located in channel 420 and post 452 is located in channel 440, second surface 416 of cellular access point 210 can touch first surface 434 of device module 220. In addition, second surface 436 of device module 220 can touch first surface 456 of base section 454 of ground element 230. In some implementations, second surface 436 of housing 432 of device module 220 can be sized and configured to make an interference fit with base section 454 of ground element 230. An interference fit can be a fit between two parts in which the external dimension of one part slightly exceeds the internal dimension of the other part into which the part has to fit.

In some implementations, post 452 of ground element 230 can connect with channel 420 of cellular access point 210 and/or channel 440 of device module 220. For example, post 452 can make an interference fit with channel 420 to hold cellular access point 210 in place with respect to ground element 230. In some implementations, channel 420 of cellular access point 210 can include electrical contacts (e.g., conductive surfaces, conductive metal pieces, tabs, pads, vias, pins, spring pins, galvanic pins, pogo pins, etc.) to make an electrical connection with post 452 of ground element 230. For example, the electrical contacts of channel 420 can contact one or more protrusions 466 of post 452 to make an electrical connection between cellular access point 210 and ground element 230.

By providing electrical contacts to make an electrical connection between cellular access point 210 and ground element 230, ground element 230 can provide a ground plane that is larger than the ground plane that is present when cellular access point 210 is not electrically connected to ground element 230. The larger ground plane provided by ground element 230 enhances radio performance of the antenna(s) of cellular access point 210.

In some implementations, device module 220 can connect with post 452 of ground element 230 but device module 220 might not make an electrical connection with ground element 230. For example, the housing 432 of device module 220 can make an interference fit with post 452 and housing 432 can be made from a material that insulates device module 220 from ground element 230. In some implementations, housing 432 of device module 220 can electrically isolate device module 220 from cellular access point 210 and/or ground element 230. For example, housing 432 can be made from an insulating material that prevents the emission of electromagnetic interference from device module 220.

By not electrically connecting with ground element 230 and/or electrically isolating device module 220, device module 220 can avoid interfering with a signal provided by cellular access point 210 based on an electrical connection between cellular access point 210 and ground element 230.

In some implementations, one or more device modules 220 can be connected to device module 220. For example, a first device module 220 that includes a battery can be connected to a second device module 220 that includes a camera. In some implementations, two or more device modules 220 can be connected to cellular access point 210 simultaneously. For example, cellular access point 210 can be connected to a first device module 220 that includes a battery and the first device module can be connected to a second device module 220 that includes a camera. In such a case, cellular access point 210 can receive power associated with the battery based on an electrical connection between the first device module 220 and cellular access point 210 and cellular access point 210 can receive data associated with the camera based on an electrical connection between cellular access point 210, first device module 220, and the second device module 220.

In some implementations, cellular access point 210 can have an electrical connection through device module 220 to ground element 230. For example, when cellular access point 210 is mounted on device module 220 and device module 220 is mounted on base section 454 of ground element 230, an electrical connection can be made between ground element 230 and cellular access point 210 based on a conductive path (e.g., a wire, a conductive strip, etc.) through device module 220.

As shown in FIG. 4B, mobile hotspot system 240 can include cellular access point 210 that can include interface 422. For example, second surface 416 of cellular access point 210 can include interface 422. In some implementations, interface 422 can include a protruded pad (e.g., a protruded circular pad). In some implementations, interface 422 can include a plurality of electrical contacts 424 (e.g., conductive surfaces, conductive metal pieces, tabs, pads, vias, pins, spring pins, galvanic pins, pogo pins, etc.) for providing and/or receiving power and/or data. In some implementations, electrical contacts 424 are configured to mate with electrical contacts 444 of interface 442.

In some implementations, interface 442 can be complementary to interface 422. For example, the protruded circular pad of interface 422 can fit into the recessed circular pad of interface 442. Additionally, the electrical contacts 424 of interface 422 can align with the electrical contacts 444 of interface 442. In some implementations, interface 442 can make an interference fit with interface 422.

In some implementations, interface 422 of cellular access point 210 and interface 442 of device module 220 can provide a connection (e.g., an electrical connection) between cellular access point 210 and device module 220. For example, cellular access point 210 can receive power and/or data from device module 220 via electrical contacts 424 and 444 of interfaces 422 and 442. In some implementations, interface 422 can be configured to engage with interface 442 when cellular access point 210 and device module 220 are aligned based on post 452 of ground element 230.

In some implementations, when device module 220 is connected to cellular access point 210, communication (e.g., handshaking, etc.) can occur through interface 422 of cellular access point 210 and interface 442 of device module 220. For example, a USB handshake can be implemented via interfaces 422 and 442 of cellular access point 210 and device module 220.

By providing interfaces 422 and 442 between cellular access point 210 and device module 220, device module 220 can be quickly and easily connected to cellular access point 210 and device module 220 can have reliable access to a data network via cellular network 280. Further, by providing an electrical connection between cellular access point 210 and device module 220, a user can experience increased speed, security, and/or privacy associated with data communication between cellular access point 210 and device module 220, as well as less potential interference than compared to a wireless signal. Additionally, interfaces 422 and 442 of cellular access point 210 and device module 220 can allow for higher-layer communication between cellular access point 210 and device module 220 (e.g., to configure cellular access point and/or device module 220, etc.).

In some implementations, cellular access point 210 and/or device module 220 can provide an indication (e.g., a visible indication, an auditory indication, a tactile sensation, etc.) to the user when cellular access point 210 and device module 220 establish an electrical connection via interfaces 422 and 442. For example, cellular access point 210 can include a light on first surface 414 that is activated when the electrical connection is established based on interfaces 422 and 442.

In some implementations, second surface 416 of cellular access point 210 can engage with first surface 434 of device module 220. For example, second surface 416 can include a magnet that is attracted to first surface 434 and vice versa. In some implementations, first surface 434 can include a magnet and second surface 416 can include a magnet and the magnets attract each other. In some implementations, second surface 416 and/or first surface 434 can include a treatment that causes cellular access point 210 to be held in place with respect to device module 220 or vice versa. For example, second surface 416 can have a rough surface that is complimentary to a rough surface of first surface 434 and prevents slippage between cellular access point 210 and device module 220.

By providing a way for second surface 416 of cellular access point 210 to engage with first surface 434 of device module 220, second surface 416 and first surface 434 help to hold cellular access point 210 in engagement with device module 220 and vice versa.

As shown in FIG. 4C, mobile hotspot system 240 can include cellular access point 210 that can include one or more recesses 426 that are located in channel 420. In some implementations, the one or more recesses 426 can be complimentary to one or more protrusions 466 located on post 452 of ground element 230. For example, the one or more protrusions 466 can provide an interference fit with the one or more recesses 426. In some implementations, the one or more recesses 426 can include electrical contacts that provide an electrical connection between cellular access point 210 and ground element 230. For example, the electrical contacts in the one or more recesses 426 can make the electrical connection with the one or more protrusions 466 on post 452 of ground element 230. In some implementations, the one or more protrusions 466 can include a conductive spring pin. For example, the conductive spring pin can be configured to retract inward towards post 452 as the one or more recesses 426 are brought into engagement with the spring pin.

By providing the one or more protrusions 466 with a conductive spring pin, the conductive spring pin allows for easier connection between cellular access point 210 and ground element 230 as compared to a solid or rigid electrical contact associated with protrusions 466.

In some implementations, the one or more recesses 426 and the one or more protrusions 466 can be configured so that when cellular access point 210 is mounted on device module 220 and post 452 is located within channel 420, an electrical connection is made between cellular access point 210 and ground element 230 based on electrical contacts in the one or more recesses 426 and the one or more protrusions 466. In some implementations, interface 422 of cellular access point 210 and interface 442 of device module 220 are configured to make an electrical connection when an electrical connection is made between electrical contacts in the one or more recesses 426 and the one or more protrusions 466.

In some implementations, device module 220 can include one or more recesses that are the same or similar to one or more recesses 426. For example, device module 220 can include the one or more recesses within channel 440 that are the same or similar to one or more recesses 426 described above.

Figure 4D:
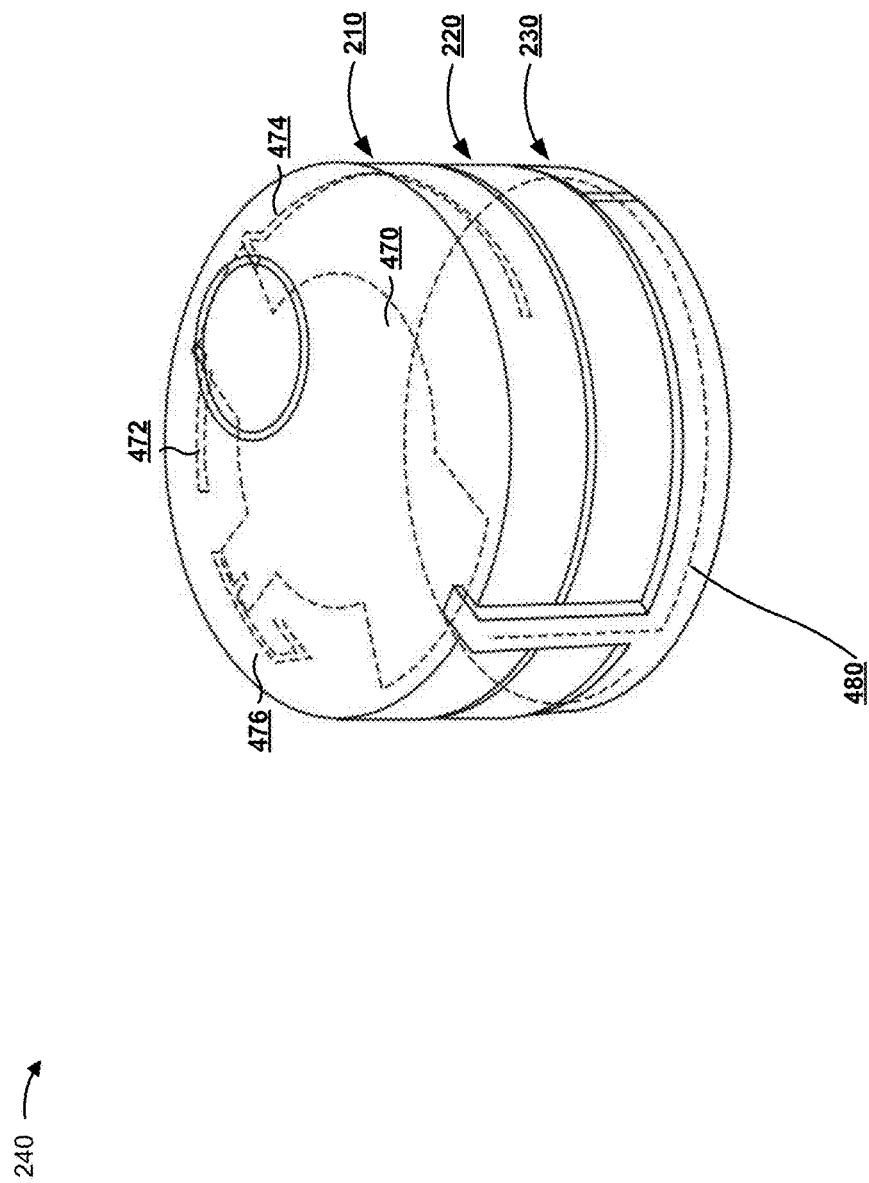

As shown in FIG. 4D, mobile hotspot system 240 can include cellular access point 210 that can include a plurality of components for providing access to cellular network 280. For example, cellular access point 210 can include a printed circuit board (PCB) 470 and a plurality of cellular antennas. In some implementations, the plurality of cellular antennas can include first main antenna 472, second main antenna 474, and diversity antenna 476. In some implementations, diversity antenna 476 provides an antenna for receiving a signal that can be received based on better signal strength to diversity antenna 476 where the signal would otherwise be received by first main antenna 472 or second main antenna 474. In some implementations, ground plane 480 is the ground plane provided when cellular access point 210 is electrically connected with ground element 230. In some implementations, first main antenna 472, second main antenna 474, and/or diversity antenna 476 can be sized and configured to fit within housing 412 of cellular access point 210. For example, first main antenna 472, second main antenna 474, and diversity antenna 476 can have a radius of curvature that matches a radius of curvature of housing 412 of cellular access point 210. In some implementations, first main antenna 472, second main antenna 474, and/or diversity antenna 476 can include a microstrip antenna. In some implementations, first main antenna 472, second main antenna 474, and diversity antenna 476 can provide for 3-way diversity and/or 4 by 3 Multiple-Input Multiple-Output (MIMO) support.

In some implementations, first main antenna 472 can be an antenna for Band 4 of the LTE frequency spectrum. For example, first main antenna 472 can support transmitting and receiving information in Band 4. In some implementations, second main antenna 474 can be an antenna be for Band 13 of the LTE spectrum. For example, second main antenna 474 can support transmitting and receiving information in Band 13. In some implementations, diversity antenna 476 can be an antenna that covers Band 4 and Band 13 of LTE frequency bands and/or can provide spatial diversity for a radio signal received by cellular access point 210. For example, diversity antenna 476 can support receiving information in Band 4 and Band 13 as well as multiple-input and multiple-output (MIMO) functionality. In some implementations, cellular access point 210 can include additional cellular antennas for additional or different frequency bands. In some implementations, cellular access point 210 can include additional cellular antennas for antenna diversity.

In some implementations, first main antenna 472, second main antenna 474, and/or diversity antenna 476 can be configured to act as a monopole antenna with a ground plane (e.g., a ground plane provided by PCB 470 and/or ground plane 480 provided by ground element 230). In some implementations, first main antenna 472, second main antenna 474, and/or diversity antenna 476 can act as a monopole antenna and the ground plane can cause first main antenna 472, second main antenna 474, and/or diversity antenna 476 to have behavior that is similar to a dipole antenna based on reflections of a radio signal from the ground plane.

In some implementations, PCB 470 can provide a ground plane to reflect radio signals transmitted by or received by first main antenna 472, second main antenna 474, and/or diversity antenna 476. In some implementations, performance of PCB 470 (e.g., reflection of radio signals by PCB 470) can be limited by the size of PCB 470 and spacing of PCB 470 in relation to first main antenna 472, second main antenna 474, and/or diversity antenna 476. By providing an electrical connection between cellular access point 210 and ground element 230, ground element 230 can provide ground plane 480 that can be larger than the ground plane provided by PCB 470. Accordingly, ground plane 480 can enhance radio performance of first main antenna 472, second main antenna 474, and/or diversity antenna 476.

Figure 4E:
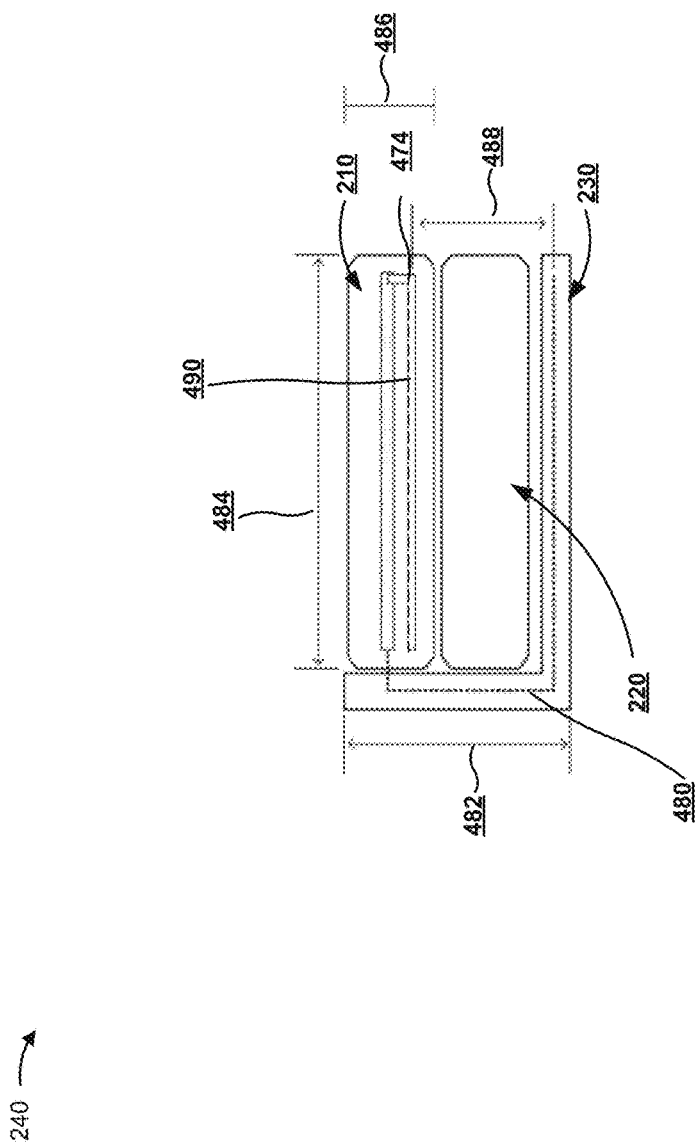

As shown in FIG. 4E, various dimensions of mobile hotspot system 240 are shown. In some implementations, height 482 of mobile hotspot system 240 can be between approximately 34 mm and approximately 36 mm. In some implementations, height 482 can be approximately 35 mm. In some implementations, diameter 484 of cellular access point 210 can be between approximately 65 mm and approximately 70 mm. In some implementations, diameter 484 can be approximately 68 mm. In some implementations, a diameter of device module 220 can be the same or similar to diameter 484. In some implementations, height 486 of cellular access point 210 can be between approximately 13 mm and 17 mm. In some implementations, height 486 of cellular access point 210 can be approximately 13 mm. In some implementations, a height of device module 220 can be the same or similar to height 486.

In some implementations, distance 488 between second main antenna 474 of cellular access point 210 and ground plane 480 provided when cellular access point 210 is electrically connected with ground element 230 can be between approximately 20 mm and approximately 25 mm. In some implementations, distance 488 can be approximately 23 mm. In some implementations, a distance between first main antenna 472 and/or diversity antenna 476 and ground plane 480 can be the same or similar to distance 488.

In some implementations, two or more device modules 220 can be placed between cellular access point 210 and ground element 230 to increase the distance between an antenna of cellular access point 210 and ground plane 480 provided by ground element 230. For example, mobile hotspot system 240 can include three (or more) modules. In some implementations, another component (e.g., a non-conductive component) can be placed between cellular access point 210 and ground element 230 to provide a predetermined distance between cellular access point 210 and ground element 230. For example, a plastic bridge piece can be placed between cellular access point 210 and ground element 230 to provide the predetermined distance.

In some implementations, an antenna (e.g., first main antenna 472, second main antenna 474, or diversity antenna 476) of cellular access point 210 can be oriented so that an axis of the antenna is aligned with ground plane 480 provided by ground element 230. For example, second main antenna 474 can be oriented so that longitudinal axis 490 of second main antenna 474 is approximately in parallel to ground plane 480.

Although FIGS. 4A-4E show an example implementation of mobile hotspot system 240, in some implementations, mobile hotspot system 240 can include additional components, fewer components, different components, or differently arranged components than those depicted in FIGS. 4A-4E.

Figure 5:
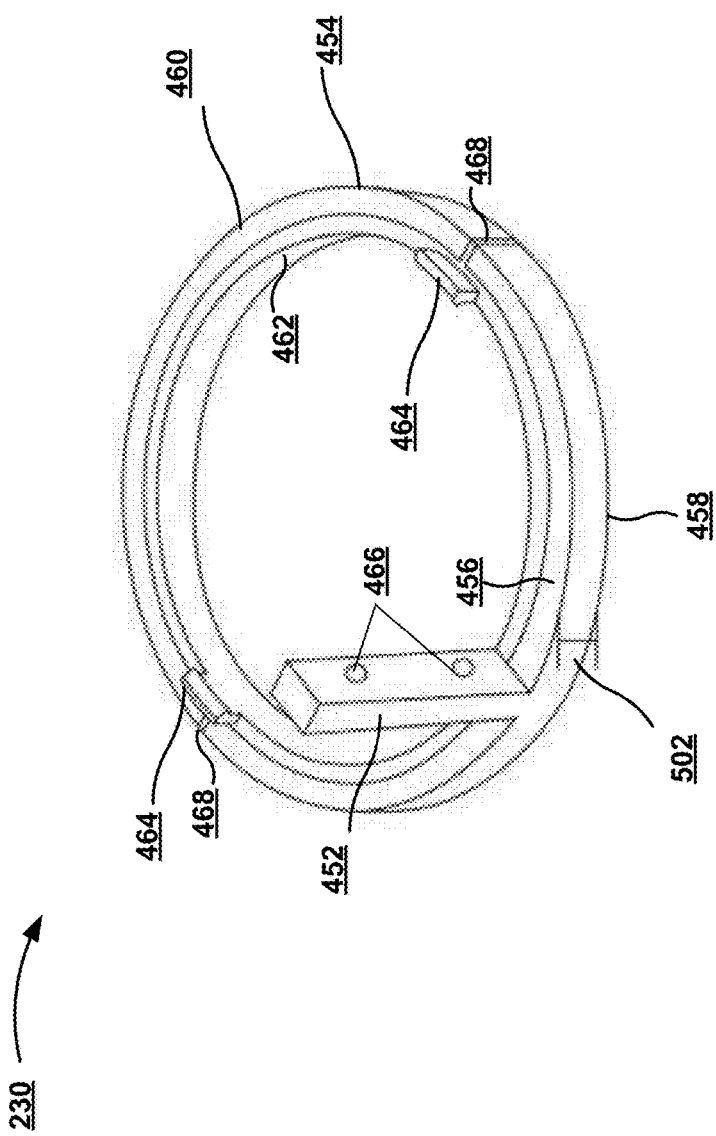
FIG. 5 is a diagram of an example implementation of a ground element of the mobile hotspot system shown in FIGS. 4A-4E.

FIG. 5 is a diagram of an example implementation of ground element 230 of mobile hotspot system 240. As shown in FIG. 5, ground element 230 of mobile hotspot system 240 can include post 452 and base section 454. In some implementations, base section 454 of ground element 230 can include conductive section 460 and non-conductive section 462. In some implementations, conductive section 460 and/or non-conductive section 462 can have a shape that corresponds to or is complimentary to a shape of base section 454, cellular access point 210, and/or device module 220. For example, conductive section 460 and non-conductive section 462 can have an annular shape that matches the shape of base section 454.

In some implementations, conductive section 460 can have a radius of curvature that is the same or similar to a radius of curvature of non-conductive section 462. In some implementations, second surface 436 of device module 220 can extend into a space at an interior of the annular shape of non-conductive section 462. In some implementations, non-conductive section 462 can make a flat planar surface inside of the annular shape of conductive section 460. The flat planar can support second surface 436 of device module 220 when device module 220 is mounted on base section 454 of ground element 230.

In some implementations, conductive section 460 can include a material such as a conductor (e.g., a metal, aluminum, copper, steel, gold, electroceramics, a semiconductor, combinations of conductors, etc.). In some implementations, non-conductive section 462 can include a material such as an insulator (e.g., plastics, rubber, glass, ceramics, wood, combinations of insulators, etc.). In some implementations, base section 454 can include combinations of materials that are conductors without materials that are insulators. In some implementations, post 452 is made from the same material as conductive section 460. In some implementations, post 452 is made integrally with conductive section 460. For example, post 452 and at least a portion of conductive section 460 can be made from a single piece of metal.

In some implementations, non-conductive section 462 can include one or more tabs 464. For example, the one or more tabs 464 can extend away from first surface 456 in a direction parallel to post 452. In some implementations, the one or more tabs 464 can be configured to hold device module 220 (or cellular access point 210) in place with respect to ground element 230 when device module 220 (or cellular access point 210) is mounted on base section 454 of ground element 230. In some implementations, device module 220 (or cellular access point 210) can include one or more recesses into which the one or more tabs 464 are received.

In some implementations, ground element 230 can include one or more gaps 468 that are sized and configured to provide and/or enhance resonance associated with radio signals that are received and/or transmitted by cellular access point 210 when cellular access point 210 is electrically connected with ground element 230. For example, conductive section 460 of ground element 230 can include one or more gaps 468. In some implementations, one or more gaps 468 can be sized and configured so that the conductive section 460 can include one or more subsections. For example, ground element 230 can include two gaps 468 so that the conductive section 460 includes two subsections. In some implementations, the length of the one or more subsections of conductive section 460 can provide and/or enhance resonance regarding a radio signal associated a frequency band in which cellular access point 210 operates to enhance radio performance of the antenna(s) of cellular access point 210 with regard to cellular network 280. In some implementations, the one or more gaps 468 can be filled with an insulator. For example, the one or more gaps 468 can be filled with over-molded plastic (e.g., polycarbonate, acrylonitrile butadiene styrene (ABS), etc.) that is part of the non-conductive section 462 of ground element 230. In some implementations, the one or more gaps 468 can be located at points in the base section 454 to break conductivity in the base section 454. In some implementations, the non-conductive section 462 can be configured to support the conductive section 460 so that the one or more gaps 468 have a predetermined length.

In some implementations, post 452 can include one or more protrusions 466 that can provide a connection (e.g., an electrical connection) between post 452 of ground element 230 and a module. In some implementations, the one or more protrusions 466 can be located on post 452 based on a height of a module (e.g., cellular access point 210, device module 220). In some implementations, a height of post 452 can be based on a number of modules that are to be connected to ground element 230 based on post 452. In some implementations, height 502 of base section 454 of ground element 230 can be between approximately 4 mm and approximately 8 mm. For example, height 502 of base section 454 of ground element 230 can be approximately 3 mm.

In some implementations, ground element 230 can have a permanent or non-permanent attachment mechanism for attaching ground element 230 to a surface. For example, ground element 230 can include screw holes, strong adhesive, or the like for ground element 230 to be attached to a surface permanently. In some implementations, ground element 230 can include a weak adhesive, tacky rubber, suction cup(s), or the like for ground element 230 to be attached to a surface non-permanently. In some implementations, the permanent or non-permanent attachment mechanism can be located on second surface 458 of base section 454.

By providing an attachment mechanism associated with ground element 230, ground element 230 can be held in place with respect to a surface and can allow a user to place mobile hotspot system 240 in locations where mobile hotspot system 240 might otherwise be unstable.

Although FIG. 5 shows an example implementation of ground element 230 of mobile hotspot system 240, in some implementations, in some implementations, ground element 230 can include additional components, fewer components, different components, or differently arranged components than those depicted in FIG. 5.

Figure 6A:
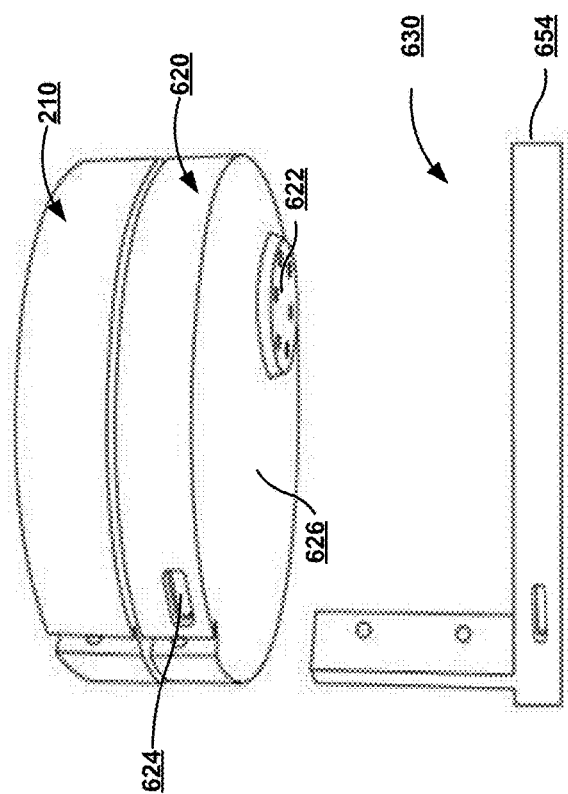
FIGS. 6A and 6B are diagrams of an example implementation of a mobile hotspot system.
Figure 6B:
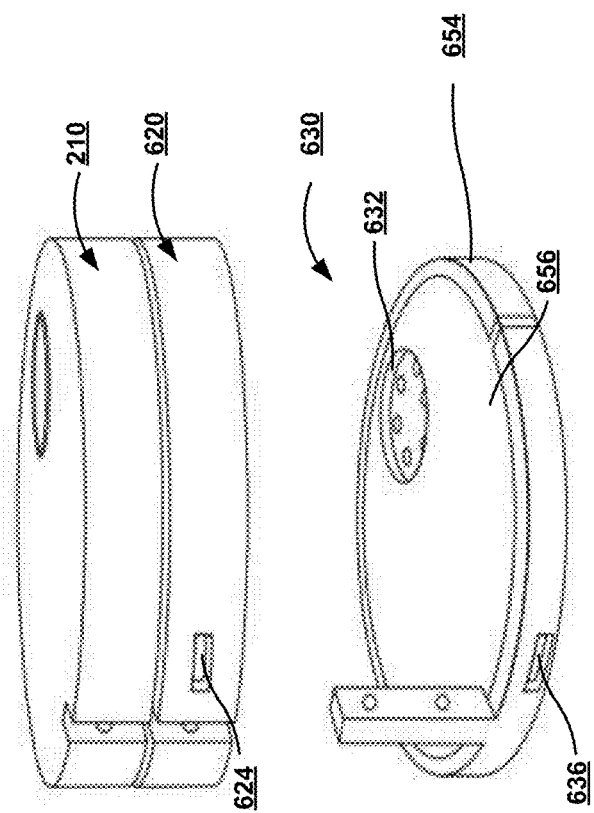

FIGS. 6A and 6B are diagrams of an example implementation of a mobile hotspot system 640. As shown in FIGS. 6A and 6B, mobile hotspot system 640 can include cellular access point 210, device module 620, and ground element 630. In some implementations, mobile hotspot system 640 can be the same or similar to mobile hotspot system 240. Potential differences between device module 620 and device module 220 are described below. In some implementations, device module 620 can be similar to device module 220. Potential differences between device module 620 and device module 220 are described below. In some implementations, ground element 630 can be similar to ground element 230. Potential differences between ground element 630 and ground element 230 are described below.

As further shown in FIG. 6A, device module 620 can include first interface 622 and second interface 624. In some implementations, first interface 622 can include a protruded circular pad that extends away from second surface 626 of device module 620. In some implementations, first interface 622 can be the same or similar to interface 422 of cellular access point 210. For example, first interface 622 can include six electrical contacts that can be the same or similar to electrical contacts 424 of interface 422. In some implementations, second interface 624 of device module 620 can include a socket for communicating power and/or data. For example, second interface 624 can include a USB port.

In some implementations, second interface 624 can allow device module 620 to charge an electronic device that is electrically connected to device module 620 via second interface 624 (e.g., a cell phone, a tablet, a laptop, etc.). For example, device module 620 can include a battery and the battery can charge a cell phone connected to device module 620 via second interface 624. In some implementations, device module 620 can charge an electronic device electrically connected to device module 620 via second interface 624 when device module 620 is not connected to cellular access point 210 and/or ground element 630. In some implementations, device module 620 can be charged via second interface 624. For example, an alternating current (AC) adaptor can be plugged into second interface 624 at a first end and the AC adaptor can be plugged into an electrical socket at a second end to provide electricity to device module 620.

In some implementations, device module 620 can receive information (e.g., data, commands, configurations, etc.) via second interface 624. For example, device module 620 can receive information associated with a configuration setting for a home sensor of device module 620. In some implementations, device module 620 can receive information associated with cellular access point 210 via second interface 624. For example, device module 620 can receive a configuration setting for WLAN network 260 provided by cellular access point 210 via second interface 624. In some implementations, device module 620 can provide information received via second interface 624 to cellular access point 210. For example, device module 620 can provide the configuration setting for WLAN network 260 to cellular access point 210 based on interface 442 (not shown in FIGS. 6A and 6B) of device module 620 and interface 422 (not shown in FIGS. 6A and 6B) of cellular access point 210.

As further shown in FIG. 6B, ground element 630 can include first interface 632 and second interface 636. In some implementations, first interface 632 can include a recessed circular pad in first surface 656 of base section 654 of ground element 630. In some implementations, first interface 632 can be the same or similar to interface 442 of device module 220. For example, first interface 632 can include six electrical contacts that can be the same or similar to electrical contacts 444 of interface 442. In some implementations, second interface 636 of ground element 630 can include a socket for communicating power and/or data. For example, second interface 636 can include a USB port. In some implementations, second interface 636 can be the same or similar to second interface 624 of device module 620.

In some implementations, ground element 630 can provide power to an electronic device that is electrically connected to ground element 630 via second interface 636 (e.g., a cell phone, a tablet, a laptop, etc.). For example, ground element 630 can include an electrical cord and plug that can be plugged into an electrical socket to provide electricity to ground element 630 and ground element 630 can charge a cell phone connected to device module 620 via second interface 624 based on the electrical connection to the electrical socket. In some implementations, ground element 630 can receive power via second interface 636. For example, an AC adaptor can be plugged into second interface 636 at a first end and the AC adaptor can be plugged into an electrical socket at a second end to provide electricity to ground element 630.

In some implementations, ground element 630 can provide power to an electronic device that is electrically connected to ground element 630 via second interface 636 based on device module 620. For example, device module 620 can include a battery and ground element 630 can receive power via first interfaces 622 and 632 of device module 620 and ground element 630. The power can be provided to a cell phone connected to ground element 630 via second interface 636. In some implementations, ground element 630 can provide power to device module 620 and/or cellular access point 210. For example, ground element 630 can provide power to device module 620 via first interfaces 622 and 632 of device module 620 and ground element 630 based on power provided by a power source that is electrically connected to ground element 630 via second interface 636.

In some implementations, ground element 630 can receive information (e.g., data, a command, a configuration setting, etc.) via second interface 636. For example, ground element 630 can receive information associated with a configuration setting for a home sensor of device module 620. In some implementations, ground element 630 can provide the information received via second interface 636 to device module 620. For example, ground element 630 can provide the configuration setting for the home sensor to device module 620 based on first interface 632 of ground element 630 and first interface 622 of device module 620.

As further shown in FIG. 6B, base section 654 of ground element 630 can include first surface 656. In some implementations, first surface 656 can support device module 620 when device module 620 is mounted on base section 654 of ground element 630. For example, first surface 656 can include a flat planar surface that corresponds to second surface 626 to support device module 620 when device module 620 is mounted on base section 654 of ground element 630.

Although FIGS. 6A and 6B show an example implementation of mobile hotspot system 640, in some implementations, mobile hotspot system 640 can include additional components, fewer components, different components, or differently arranged components than those depicted in FIG. 6.

The foregoing disclosure provides illustration and description, but is not intended to be exhaustive or to limit the implementations to the precise form disclosed. Modifications and variations are possible in light of the above disclosure or can be acquired from practice of the implementations.

As used herein, the term component is intended to be broadly construed as hardware, firmware, or a combination of hardware and software.

To the extent the aforementioned embodiments collect, store, or employ personal information provided by individuals, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

Even though particular combinations of features are recited in the claims and/or disclosed in the specification, these combinations are not intended to limit the disclosure of possible implementations. In fact, many of these features can be combined in ways not specifically recited in the claims and/or disclosed in the specification. Although each dependent claim listed below can directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and can be used interchangeably with "one or more." Furthermore, as used herein, the term "set" is intended to include one or more items (e.g., related items, unrelated items, a combination of related and unrelated items, etc.), and can be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
a first module to provide a wireless network,
where the first module includes one or more cellular antennas;
a second module; and
a first ground element to be electrically connected to the first module and to be connected to the second module,
where the first module, the second module, and the first ground element are stackable,
where the one or more cellular antennas have a first ground plane provided by a second ground element included in the first module,
where the first ground element is to provide a second ground plane for the one or more cellular antennas when the first ground element is electrically connected to the one or more cellular antennas,
where the second ground plane is larger than the first ground plane, and
where radio performance of the one or more cellular antennas with regard to a cellular network is enhanced when the one or more cellular antennas are electrically connected to the first ground element based on the second ground plane.

2. The device of claim 1, where the radio performance of the one or more cellular antennas is further enhanced with regard to the cellular network when the one or more cellular antennas are electrically connected to the first ground element and the one or more cellular antennas are located a predetermined distance from the second ground plane.

3. The device of claim 2, where the one or more cellular antennas are located the predetermined distance from the second ground plane when the first module is mounted on the second module and the second module is mounted on the first ground element.

4. The device of claim 1, where the first module includes a first interface,
where the second module includes a battery and a second interface, and
where the second module is to provide power to the first module via an electrical connection between the first interface and the second interface.

5. The device of claim 4, where the electrical connection is a first electrical connection, the second module includes a third interface, and the device further comprises:
a third module,
where the third module includes an electronic device and a fourth interface, and
where the third module is to provide information associated with the electronic device to the first module via the first electrical connection between the first interface and the second interface and a second electrical connection between the third interface and the fourth interface.

6. The device of claim 1, where the first module includes a first interface,
where the second module includes an electronic device and a second interface, and
where the second module is to provide information associated with the electronic device to the first module via an electrical connection between the first interface and the second interface.

7. A device, comprising:
a module including one or more cellular antennas; and
a first ground element to be electrically connected to the module,
where the first ground element and the module are stackable,
where the one or more cellular antennas have a first ground plane provided by a second ground element included in the module,
where the first ground element is to provide a second ground plane for the one or more cellular antennas when the first ground element is electrically connected to the one or more cellular antennas,
where the second ground plane is larger than the first ground plane, and
where radio performance of the one or more cellular antennas with regard to a cellular network is enhanced when the one or more cellular antennas are electrically connected to the first ground element based on the second ground plane.

8. The device of claim 7, where the module includes a housing,
where the one or more cellular antennas include at least two cellular antennas, and
where the at least two cellular antennas are located in the housing.

9. The device of claim 7, where the one or more cellular antennas include a longitudinal axis,
where the longitudinal axis is aligned approximately in parallel with the second ground plane when the one or more cellular antennas are electrically connected to the first ground element.

10. The device of claim 7, where the module has a cylindrical shape, and
where the module has a diameter that is between approximately 65 mm and approximately 70 mm.

11. The device of claim 7, where the module includes an interface to receive power, data, or a combination thereof.

12. The device of claim 7, where the first ground element includes a post that is conductive,
where the module includes a channel in a side surface of the module,
where a size and shape of the channel is complimentary to a size and shape of the post, and
where the channel includes one or more electrical contacts to electrically connect the one or more cellular antennas to the first ground element via the post.

13. The device of claim 12, where the post includes one or more protrusions,
where the channel includes one or more recesses that are complimentary to the one or more protrusions, and
where the one or more protrusions are to engage with the one or more recesses to hold the module with respect to the first ground element.

14. A device, comprising:
a first ground element to be electrically connected to a module including a cellular antenna,
where the first ground element and the module are stackable,
where the cellular antenna has a first ground plane provided by a second ground element included in the module,
where the first ground element is to provide a second ground plane for the cellular antenna when the first ground element is electrically connected to the cellular antenna,
where the second ground plane is larger than the first ground plane, and where radio performance of the cellular antenna with regard to a cellular network is enhanced when the cellular antenna is electrically connected to the first ground element based on the second ground plane.

15. The device of claim 14, further comprising the module, where the module is to provide a wireless network, and where the module includes the cellular antenna and one or more electrical contacts that electrically connect the cellular antenna to the first ground element.

16. The device of claim 15, where the first ground element includes a post, and where the one or more electrical contacts are to electrically connect the cellular antenna to the first ground element via the post.

17. The device of claim 14, where the first ground element is electrically connected to the second ground element when the cellular antenna is electrically connected to the first ground element.

18. The device of claim 14, where the first ground element includes a base section, where the base section of the first ground element includes at least one gap, and where the at least one gap is to enhance resonance associated with a radio signal received by the cellular antenna when the module is electrically connected to the first ground element.

19. The device of claim 14, where the first ground element includes a post and a base section, where the post extends away from the base section, where the post includes one or more protrusions, and where the one or more protrusions include a conductive spring pin.

20. The device of claim 19, where the base section includes a conductive section and a non-conductive section, where the conductive section includes one or more gaps, and where a portion of the non-conductive section is located within the one or more gaps.

* * * * *